United States Patent [19]
Assard

[11] 4,383,247
[45] May 10, 1983

[54] GAIN-STEP COMPANDING ANALOG TO DIGITAL CONVERTER

[75] Inventor: Gerald L. Assard, Waterford, Conn.

[73] Assignee: The United States of America as represented by the Secretary of the Navy, Washington, D.C.

[21] Appl. No.: 277,447

[22] Filed: Jun. 25, 1981

[51] Int. Cl.³ .............................................. H03K 13/02
[52] U.S. Cl. ......................... 340/347 AD; 340/347 M; 367/67
[58] Field of Search .... 340/347 M, 347 AD, 347 NT; 367/65-67

[56] References Cited
U.S. PATENT DOCUMENTS

| | | | |
|---|---|---|---|
| 3,376,557 | 4/1968 | Godinez | 340/172.5 |
| 3,685,047 | 8/1972 | Sherer et al. | 340/15.5 |
| 3,696,403 | 10/1972 | DiRocco | 324/99 D |
| 3,699,325 | 10/1972 | Montgomery, Jr. et al. | 235/154 |
| 3,879,724 | 4/1975 | McDonald | 340/347 NT X |
| 3,936,819 | 2/1976 | Angelle et al. | 340/347 |
| 4,251,802 | 2/1981 | Horna | 340/347 |

Primary Examiner—T. J. Sloyan
Attorney, Agent, or Firm—Robert F. Beers; Arthur A. McGill; Prithvi C. Lall

[57] ABSTRACT

A system for analog-to-digital conversion provides a dynamic range in excess of 120 dB yet requires an output of only 9 bits. These bits are utilized to transmit a companded digital word format including sign information. Use of this companded output format results in significant transmit bandwidth reduction compared with transmit bandwidths required for conventional linear bit formats. This companding results in a worse case error of 3.125%.

1 Claim, 3 Drawing Figures

GAIN-STEP COMPANDING ANALOG TO DIGITAL CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Digital telemetry systems are a requirement in most towed underwater sonars in order to multiplex and digitize a large number of acoustic and nonacoustic sensors. Usually the telemetry must be capable of transmitting its signal in a reliable manner to a cable/array system 1 to 2 miles in length. The cable diameter is minimized to reduce hydrodynamic drag, and this limits the overall telemetry bandwidth. In addition, the telemetry system must be capable of operating over a very large acoustic dynamic range and increasing individual channel bandwidths. These requirements, large number of sensors, limited cable bandwidth, high dynamic range, and wide acoustic sensor bandwidths, are often conflicting. They oblige the designers of towed acoustic arrays to seek out novel and innovative schemes to reduce telemetry bandwidths that are capable of meeting the large dynamic range requirements. This system can be used over a dynamic range in excess of 120 dB that requires only 9 bits per channel. Normally a system that operates over a 120 dB dynamic range would need 20 bits per channel. The reduction from 20 to 9 bits per channel is a savings of over 2 to 1 in bandwidth reduction. Thus, this system is beneficial in that it meets the large dynamic range requirements, yet reduces the telemetry bandwidth requirements.

SUMMARY OF THE INVENTION

The system incorporates a technique used to implement the 19 bit plus sign conversion into an 8 bit plus sign output. The 8 bit includes a 4 bit mantissa and a 4 bit exponent. The input signal is prewhitened such that it is nearly a flat spectrum going into the gain control units. The analog portion changes the level of the signal in order to maintain the signal within an amplitude window. The system converts an analog signal into an 11 bit plus sign output that is processed with the output from the gain control units and converted into an 8 bit plus sign code.

DESCRIPTION OF THE PREFERRED EMBODIMENT

Figure 1:
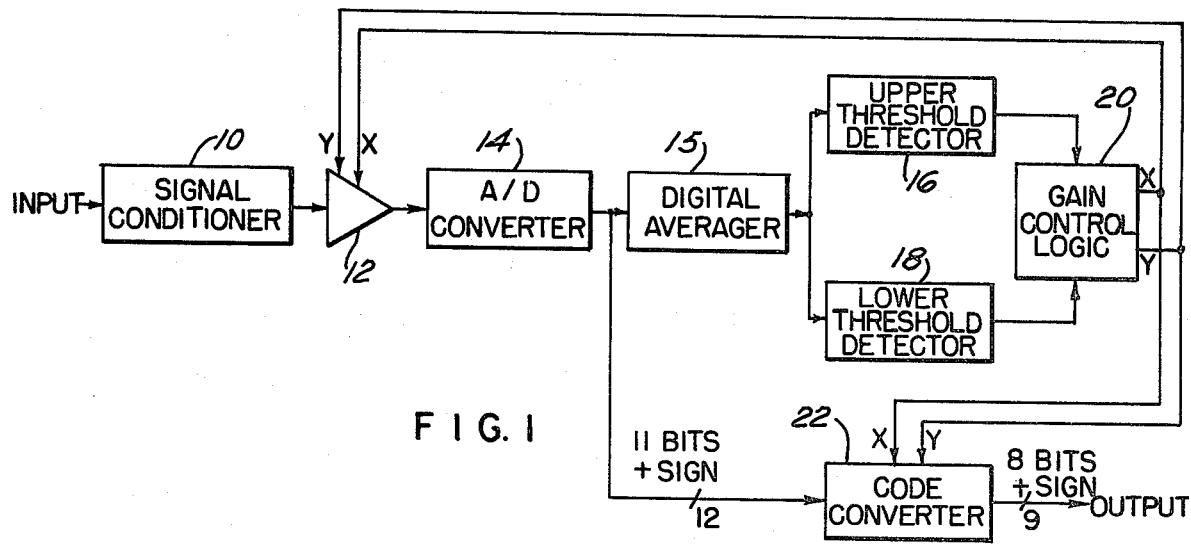
FIG. 1 is a diagram of the present invention.

Referring now to FIG. 1 there is shown a block diagram of standard analog and binary devices. An analog signal is provided as an input to signal conditioner 10. The signal conditioner prewhitens the input and feeds it to the input of digitally switched gain amplifier 12.

The gain of amplifier 12 increases or decreases in discrete steps as the input voltage to it decreases or increases, respectively. For low-level input signals, the amplifier is switched to its maximum gain of 48 dB. The output of the amplifier 12 is fed to the A/D converter 14. A numerical signal is then provided from A/D converter 14 to a digital averager 15. The digital averager 15 maintains a numerical average of the bit stream from A/D converter 14 to present an average past history of the data stream from A/D converter 14.

Figure 2:
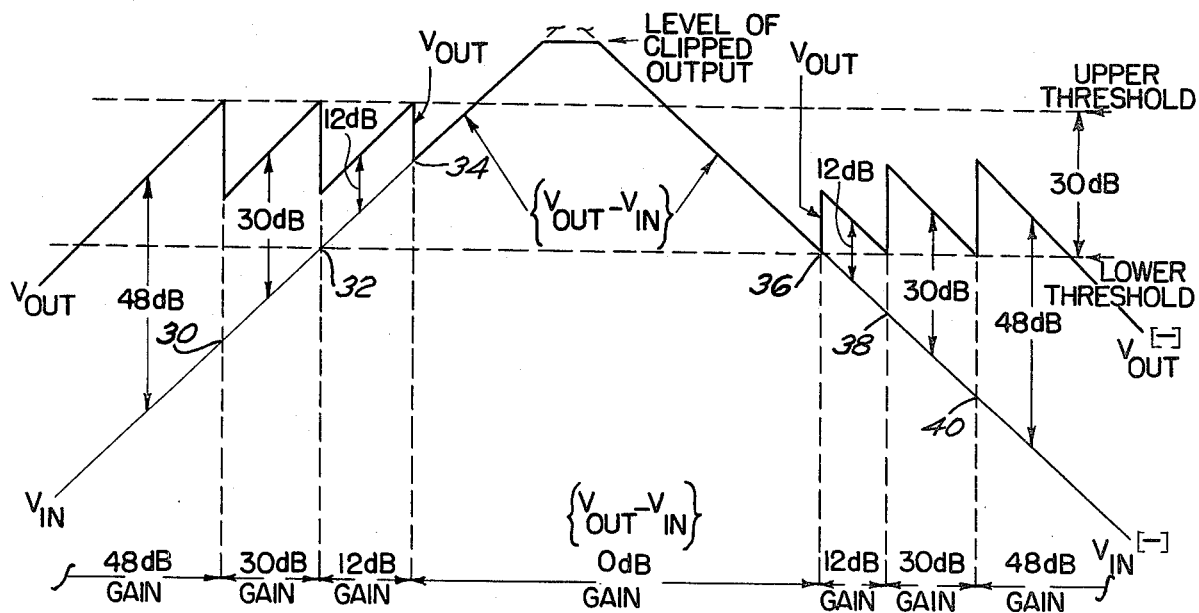
FIG. 2 shows the gain steps of the amplifier of FIG. 1.

Refer now to both FIGS. 1 and 2. The digital averager 15 output is fed to the upper threshold detector 16 and to the lower threshold detector 18. If the input signal is slowly increasing in amplitude from 0, the amplifier gain will remain at 48 dB until the signal reaches the upper threshold value at point 30. At this point 30, the upper threshold detector 16 sends a signal to the gain control logic 20 commanding a decrease in gain to 30 dB. The amplifier output level will drop by 18 dB.

The lower threshold level is set 30 dB below the upper threshold level, so the lower threshold is not exceeded when the gain drops 18 dB. As this input signal continues to increase, the upper threshold is again reached at point 32 and a decrease in gain to 12 dB is commanded. Further increase in the input signal level causes a gain decrease to 0 dB at point 34, which is the minimum gain of the amplifier. As the input signal level decreases from its maximum level, the amplifier gain will be decreased as described above, only in this case it will involve the lower threshold detector 18. This occurs at points 36, 38 and 40.

Figure 3:
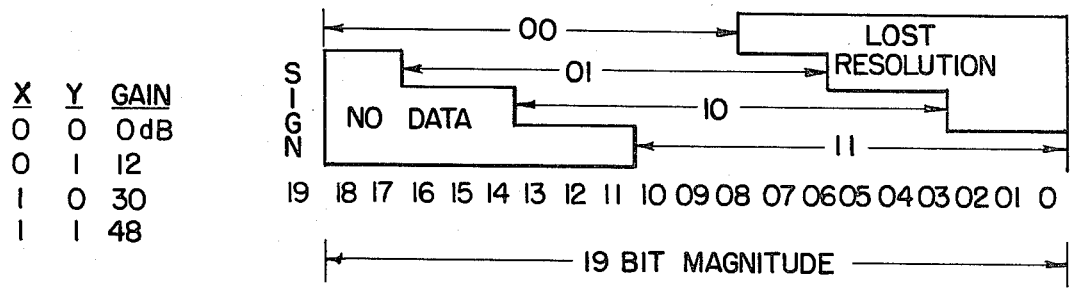
FIG. 3 shows the window of the A/D converter of FIG. 1.

The digital portion of this system includes the 11 bit plus sign ADC 14 and the code converter 22. In effect, the combination of the gain control 20 and the ADC 14 can be viewed as an equivalent 19 bit plus sign ADC. This equivalent 20 bit ADC 14 is described further in this section. FIG. 3 indicates the way this 19 bit plus sign ADC is synthesized from the 11 bit plus sign ADC 14 and the two gain control bits from gain control logic 20. When the gain is maximum, indicated by a code of 11, the 11 bit output is in the least significant bits, 0 through 10, of the 20 bit synthesized ADC. As the analog signal increases and the gain drops to 10, the 11 bit ADC 14 output is in effect moved within the 20 bit synthesized ADC 14. It extends from 03 to 13. This relative motion of the 11 bit output is continued as the gain is changed, as indicated in FIG. 3.

The companding ADC is a system for reducing the bit requirements of a linear multibit ADC. In conventional notation, a decimal number can be represented as a binary number using a decimal-to-binary conversion table. Each decimal number can be uniquely represented, using a conversion table, by a set of bits, and conversely each set of bits represents only one decimal number. As the magnitude of the decimal numbers increases, the number of binary digits required increases tremendously.

An alternate method of representing decimal number with a slight loss of accuracy is a scheme using an exponent and mantissa. The exponent denotes the position of the most significant nonzero bit. Those following the first nonzero bit are used in generating the mantissa. The exponent-mantissa method of representing a 19 bit binary number is shown in Table 1. The exponent is 0000 if the first nonzero bit is positioned no higher than the fourth bit (bit No. 3). In other cases the exponent is four less than the position of the first nonzero bit (bit No. minus three). For example, Table 1, sheet 3, in decimal No. 04096 the most significant bit in bit number 12. Subtracting three from twelve gives an exponent value of nine, in binary it reads 1001.

TABLE 1 sheet 1

| Decimal Number | 19-Bit Binary Number | | | | | | | | | | | | | | | | | | | Exponent | Mantissa | |
|---|---|---|---|---|---|---|---|---|---|---|---|---|---|---|---|---|---|---|---|---|---|---|
| | 18 | 17 | 16 | 15 | 14 | 13 | 12 | 11 | 10 | 9 | 8 | 7 | 6 | 5 | 4 | 3 | 2 | 1 | 0 | | | |
| 0 | 0 | 0 | 0 | 0 | 0 | 0 | 0 | 0 | 0 | 0 | 0 | 0 | 0 | 0 | 0 | 0 | 0 | 0 | 0 | 0000 | 0000 | |
| 1 | 0 | 0 | 0 | 0 | 0 | 0 | 0 | 0 | 0 | 0 | 0 | 0 | 0 | 0 | 0 | 0 | 0 | 0 | 1 | 0000 | 0001 | |
| 2 | 0 | 0 | 0 | 0 | 0 | 0 | 0 | 0 | 0 | 0 | 0 | 0 | 0 | 0 | 0 | 0 | 0 | 1 | 0 | 0000 | 0010 | |
| 3 | 0 | 0 | 0 | 0 | 0 | 0 | 0 | 0 | 0 | 0 | 0 | 0 | 0 | 0 | 0 | 0 | 0 | 1 | 1 | 0000 | 0011 | |
| 4 | 0 | 0 | 0 | 0 | 0 | 0 | 0 | 0 | 0 | 0 | 0 | 0 | 0 | 0 | 0 | 0 | 1 | 0 | 0 | 0000 | 0100 | |
| : | | | | | | | | | | | | | | | | | | | | : | : | Zone 1 |
| 15 | 0 | 0 | 0 | 0 | 0 | 0 | 0 | 0 | 0 | 0 | 0 | 0 | 0 | 0 | 0 | 1 | 1 | 1 | 1 | 0000 | 1111 | |
| 16 | 0 | 0 | 0 | 0 | 0 | 0 | 0 | 0 | 0 | 0 | 0 | 0 | 0 | 0 | 1 | 0 | 0 | 0 | 0 | 0001 | 0000 | |
| 17 | 0 | 0 | 0 | 0 | 0 | 0 | 0 | 0 | 0 | 0 | 0 | 0 | 0 | 0 | 1 | 0 | 0 | 0 | 1 | 0001 | 0001 | |
| 18 | 0 | 0 | 0 | 0 | 0 | 0 | 0 | 0 | 0 | 0 | 0 | 0 | 0 | 0 | 1 | 0 | 0 | 1 | 0 | 0001 | 0010 | |
| : | | | | | | | | | | | | | | | | | | | | : | : | |
| 31 | 0 | 0 | 0 | 0 | 0 | 0 | 0 | 0 | 0 | 0 | 0 | 0 | 0 | 1 | 1 | 1 | 1 | 1 | 1 | 0001 | 1111 | |
| 32 | 0 | 0 | 0 | 0 | 0 | 0 | 0 | 0 | 0 | 0 | 0 | 0 | 1 | 0 | 0 | 0 | 0 | 0 | 0 | 0010 | 0000 | |
| 33 | 0 | 0 | 0 | 0 | 0 | 0 | 0 | 0 | 0 | 0 | 0 | 0 | 1 | 0 | 0 | 0 | 0 | 0 | 1 | 0010 | 0000 | |
| 34 | 0 | 0 | 0 | 0 | 0 | 0 | 0 | 0 | 0 | 0 | 0 | 0 | 1 | 0 | 0 | 0 | 0 | 1 | 0 | 0010 | 0001 | |
| 35 | 0 | 0 | 0 | 0 | 0 | 0 | 0 | 0 | 0 | 0 | 0 | 0 | 1 | 0 | 0 | 0 | 0 | 1 | 1 | 0010 | 0001 | |
| 36 | 0 | 0 | 0 | 0 | 0 | 0 | 0 | 0 | 0 | 0 | 0 | 0 | 1 | 0 | 0 | 0 | 1 | 0 | 0 | 0010 | 0010 | |
| 37 | 0 | 0 | 0 | 0 | 0 | 0 | 0 | 0 | 0 | 0 | 0 | 0 | 1 | 0 | 0 | 0 | 1 | 0 | 1 | 0010 | 0010 | |
| : | | | | | | | | | | | | | | | | | | | | : | : | Zone 2 |
| 62 | 0 | 0 | 0 | 0 | 0 | 0 | 0 | 0 | 0 | 0 | 0 | 0 | 1 | 1 | 1 | 1 | 1 | 1 | 0 | 0010 | 1111 | |
| 63 | 0 | 0 | 0 | 0 | 0 | 0 | 0 | 0 | 0 | 0 | 0 | 0 | 1 | 1 | 1 | 1 | 1 | 1 | 1 | 0010 | 1111 | |

Exp. Gen | Mantissa Generation | Lost Bits

TABLE 1 sheet 2

| Decimal Number | 19-Bit Binary Number | | | | | | | | | | | | | | | | | | | Exponent | Mantissa | |
|---|---|---|---|---|---|---|---|---|---|---|---|---|---|---|---|---|---|---|---|---|---|---|
| | 18 | 17 | 16 | 15 | 14 | 13 | 12 | 11 | 10 | 9 | 8 | 7 | 6 | 5 | 4 | 3 | 2 | 1 | 0 | | | |
| 64 | 0 | 0 | 0 | 0 | 0 | 0 | 0 | 0 | 0 | 0 | 0 | 0 | 1 | 0 | 0 | 0 | 0 | 0 | 0 | 0011 | 0000 | |
| 65 | 0 | 0 | 0 | 0 | 0 | 0 | 0 | 0 | 0 | 0 | 0 | 0 | 1 | 0 | 0 | 0 | 0 | 0 | 1 | 0011 | 0000 | |
| 66 | 0 | 0 | 0 | 0 | 0 | 0 | 0 | 0 | 0 | 0 | 0 | 0 | 1 | 0 | 0 | 0 | 0 | 1 | 0 | 0011 | 0000 | |
| 67 | 0 | 0 | 0 | 0 | 0 | 0 | 0 | 0 | 0 | 0 | 0 | 0 | 1 | 0 | 0 | 0 | 0 | 1 | 1 | 0011 | 0000 | |
| 68 | 0 | 0 | 0 | 0 | 0 | 0 | 0 | 0 | 0 | 0 | 0 | 0 | 1 | 0 | 0 | 0 | 1 | 0 | 0 | 0011 | 0001 | |
| : | | | | | | | | | | | | | | | | | | | | : | : | Zone 3 |
| 127 | 0 | 0 | 0 | 0 | 0 | 0 | 0 | 0 | 0 | 0 | 0 | 0 | 1 | 1 | 1 | 1 | 1 | 1 | 1 | 0011 | 1111 | |
| 128 | 0 | 0 | 0 | 0 | 0 | 0 | 0 | 0 | 0 | 0 | 0 | 1 | 0 | 0 | 0 | 0 | 0 | 0 | 0 | 0100 | 0000 | |
| 129 | 0 | 0 | 0 | 0 | 0 | 0 | 0 | 0 | 0 | 0 | 0 | 1 | 0 | 0 | 0 | 0 | 0 | 0 | 1 | 0100 | 0000 | |
| 130 | 0 | 0 | 0 | 0 | 0 | 0 | 0 | 0 | 0 | 0 | 0 | 1 | 0 | 0 | 0 | 0 | 0 | 1 | 0 | 0100 | 0000 | |
| 131 | 0 | 0 | 0 | 0 | 0 | 0 | 0 | 0 | 0 | 0 | 0 | 1 | 0 | 0 | 0 | 0 | 0 | 1 | 1 | 0100 | 0000 | |
| 132 | 0 | 0 | 0 | 0 | 0 | 0 | 0 | 0 | 0 | 0 | 0 | 1 | 0 | 0 | 0 | 0 | 1 | 0 | 0 | 0100 | 0000 | |
| 133 | 0 | 0 | 0 | 0 | 0 | 0 | 0 | 0 | 0 | 0 | 0 | 1 | 0 | 0 | 0 | 0 | 1 | 0 | 1 | 0100 | 0000 | |
| 134 | 0 | 0 | 0 | 0 | 0 | 0 | 0 | 0 | 0 | 0 | 0 | 1 | 0 | 0 | 0 | 0 | 1 | 1 | 0 | 0100 | 0000 | |
| 135 | 0 | 0 | 0 | 0 | 0 | 0 | 0 | 0 | 0 | 0 | 0 | 1 | 0 | 0 | 0 | 0 | 1 | 1 | 1 | 0100 | 0000 | |
| 136 | 0 | 0 | 0 | 0 | 0 | 0 | 0 | 0 | 0 | 0 | 0 | 1 | 0 | 0 | 0 | 0 | 1 | 0 | 0 | 0100 | 0001 | |
| : | | | | | | | | | | | | | | | | | | | | : | : | Zone 4 |
| 255 | 0 | 0 | 0 | 0 | 0 | 0 | 0 | 0 | 0 | 0 | 0 | 1 | 1 | 1 | 1 | 1 | 1 | 1 | 1 | 0100 | 1111 | |

Exponent Generation | Mantissa Generation | Lost Bits

TABLE 1 sheet 3

| Decimal Number | 19-Bit Binary Number | | | | | | | | | | | | | | | | | | | Exponent | Mantissa | |
|---|---|---|---|---|---|---|---|---|---|---|---|---|---|---|---|---|---|---|---|---|---|---|
| | 18 | 17 | 16 | 15 | 14 | 13 | 12 | 11 | 10 | 9 | 8 | 7 | 6 | 5 | 4 | 3 | 2 | 1 | 0 | | | |
| 256 | 0 | 0 | 0 | 0 | 0 | 0 | 0 | 0 | 0 | 0 | 1 | 0 | 0 | 0 | 0 | 0 | 0 | 0 | 0 | 0101 | 0000 | |
| : | | | | | | | | | | | | | | | | | | | | : | : | Zone 5 |

TABLE 1 sheet 3-continued

| Decimal Number | 18 | 17 | 16 | 15 | 14 | 13 | 12 | 11 | 10 | 9 | 8 | 7 | 6 | 5 | 4 | 3 | 2 | 1 | 0 | Exponent | Mantissa | |
|---|---|---|---|---|---|---|---|---|---|---|---|---|---|---|---|---|---|---|---|---|---|---|
| 511 | 0 | 0 | 0 | 0 | 0 | 0 | 0 | 0 | 0 | 0 | 1 | 1 | 1 | 1 | 1 | 1 | 1 | 1 | 1 | 0101 | 1111 | ↓ |
| 512 | 0 | 0 | 0 | 0 | 0 | 0 | 0 | 0 | 0 | 1 | 0 | 0 | 0 | 0 | 0 | 0 | 0 | 0 | 0 | 0110 | 0000 | ↑ |
| : | | | | | | | | | | | | | | | | | | | | : | : | Zone 6 |
| 1023 | 0 | 0 | 0 | 0 | 0 | 0 | 0 | 0 | 0 | 1 | 1 | 1 | 1 | 1 | 1 | 1 | 1 | 1 | 1 | 0110 | 1111 | ↓ |
| 1024 | 0 | 0 | 0 | 0 | 0 | 0 | 0 | 0 | 1 | 0 | 0 | 0 | 0 | 0 | 0 | 0 | 0 | 0 | 0 | 0111 | 0000 | ↑ |
| : | | | | | | | | | | | | | | | | | | | | : | : | Zone 7 |
| 2047 | 0 | 0 | 0 | 0 | 0 | 0 | 0 | 0 | 1 | 1 | 1 | 1 | 1 | 1 | 1 | 1 | 1 | 1 | 1 | 0111 | 1111 | ↓ |
| 2048 | 0 | 0 | 0 | 0 | 0 | 0 | 0 | 1 | 0 | 0 | 0 | 0 | 0 | 0 | 0 | 0 | 0 | 0 | 0 | 1000 | 0000 | ↑ |
| : | | | | | | | | | | | | | | | | | | | | : | : | Zone 8 |
| 4095 | 0 | 0 | 0 | 0 | 0 | 0 | 0 | 1 | 1 | 1 | 1 | 1 | 1 | 1 | 1 | 1 | 1 | 1 | 1 | 1000 | 1111 | ↓ |
| 4096 | 0 | 0 | 0 | 0 | 0 | 0 | 1 | 0 | 0 | 0 | 0 | 0 | 0 | 0 | 0 | 0 | 0 | 0 | 0 | 1001 | 0000 | ↑ |
| : | | | | | | | | | | | | | | | | | | | | : | : | Zone 9 |
| 8191 | 0 | 0 | 0 | 0 | 0 | 0 | 1 | 1 | 1 | 1 | 1 | 1 | 1 | 1 | 1 | 1 | 1 | 1 | 1 | 1001 | 1111 | ↓ |
| 8192 | 0 | 0 | 0 | 0 | 0 | 1 | 0 | 0 | 0 | 0 | 0 | 0 | 0 | 0 | 0 | 0 | 0 | 0 | 0 | 1010 | 0000 | ↑ |
| : | | | | | | | | | | | | | | | | | | | | : | : | Zone 10 |
| 16383 | 0 | 0 | 0 | 0 | 0 | 1 | 1 | 1 | 1 | 1 | 1 | 1 | 1 | 1 | 1 | 1 | 1 | 1 | 1 | 1010 | 1111 | ↓ |

Exponent Generation | Mantissa Generation | Lost Bits

TABLE 1 sheet 4

| Decimal Number | 18 | 17 | 16 | 15 | 14 | 13 | 12 | 11 | 10 | 9 | 8 | 7 | 6 | 5 | 4 | 3 | 2 | 1 | 0 | Exponent | Mantissa | |
|---|---|---|---|---|---|---|---|---|---|---|---|---|---|---|---|---|---|---|---|---|---|---|
| 16384 | 0 | 0 | 0 | 0 | 1 | 0 | 0 | 0 | 0 | 0 | 0 | 0 | 0 | 0 | 0 | 0 | 0 | 0 | 0 | 1011 | 0000 | ↑ |
| : | | | | | | | | | | | | | | | | | | | | : | : | Zone 11 |
| 32767 | 0 | 0 | 0 | 0 | 1 | 1 | 1 | 1 | 1 | 1 | 1 | 1 | 1 | 1 | 1 | 1 | 1 | 1 | 1 | 1011 | 1111 | ↓ |
| 32768 | 0 | 0 | 0 | 1 | 0 | 0 | 0 | 0 | 0 | 0 | 0 | 0 | 0 | 0 | 0 | 0 | 0 | 0 | 0 | 1100 | 0000 | ↑ |
| : | | | | | | | | | | | | | | | | | | | | : | : | Zone 12 |
| 65535 | 0 | 0 | 0 | 1 | 1 | 1 | 1 | 1 | 1 | 1 | 1 | 1 | 1 | 1 | 1 | 1 | 1 | 1 | 1 | 1100 | 1111 | ↓ |
| 65536 | 0 | 0 | 1 | 0 | 0 | 0 | 0 | 0 | 0 | 0 | 0 | 0 | 0 | 0 | 0 | 0 | 0 | 0 | 0 | 1101 | 0000 | ↑ |
| : | | | | | | | | | | | | | | | | | | | | : | : | Zone 13 |
| 131071 | 0 | 0 | 1 | 1 | 1 | 1 | 1 | 1 | 1 | 1 | 1 | 1 | 1 | 1 | 1 | 1 | 1 | 1 | 1 | 1101 | 1111 | ↓ |
| 131072 | 0 | 1 | 0 | 0 | 0 | 0 | 0 | 0 | 0 | 0 | 0 | 0 | 0 | 0 | 0 | 0 | 0 | 0 | 0 | 1110 | 0000 | ↑ |
| : | | | | | | | | | | | | | | | | | | | | : | : | Zone 14 |
| 262143 | 0 | 1 | 1 | 1 | 1 | 1 | 1 | 1 | 1 | 1 | 1 | 1 | 1 | 1 | 1 | 1 | 1 | 1 | 1 | 1110 | 1111 | ↓ |
| 262144 | 1 | 0 | 0 | 0 | 0 | 0 | 0 | 0 | 0 | 0 | 0 | 0 | 0 | 0 | 0 | 0 | 0 | 0 | 0 | 1111 | 0000 | ↑ |
| : | | | | | | | | | | | | | | | | | | | | : | : | Zone 15 |
| 524287 | 1 | 1 | 1 | 1 | 1 | 1 | 1 | 1 | 1 | 1 | 1 | 1 | 1 | 1 | 1 | 1 | 1 | 1 | 1 | 1111 | 1111 | ↓ |

Exponent Generation | Mantissa Generation | Lost Bits

Operation of the system can best be understood by taking an example such as number 16383. Using an 18 bit format plus sign the binary number is +000 001 111 111 111 111. Let us assume that digitally switched gain amplifier 12 is at the 10 level as shown in FIG. 3.

An analog signal is applied to signal conditioner 10 that prewhitens the signal and applies it to amplifier 12. Amplifier 12 being at the 10 level provides a gain of 30 dB. The A/D converter 14 is positioned to present bits 13 through 3 of the 19 bit magnitude. In other words the binary number 1 111 111 111 1 is presented to code converter 22 and to digital averager 15. A binary number is then transmitted from the digital averager 15 to the threshold detectors 16 and 18. If the binary number from digital averager 15 has a one bit in either of the two most significant bits the upper threshold detector 16 is triggered to lower the gain control logic 20. If the digital averager 15 puts out zeros in the eight most significant bits then the lower threshold detector 18 is excited and calls the gain control 20 to raise the gain. Let us assume in the present case that the previous numbers presented to digital averager 15 are similar to the present binary number 1 111 111 111 1. In this case the upper threshold detector 16 is triggered and lowers the gain control logic 20 to the 01 level.

The code converter 22 continuously monitors the bit stream from A/D converter 14 as well as X and Y from gain control 20. It converts the digital input to an 8 bit plus sign output. In the present case the binary number portion of the output would be a four bit exponent 1010 and a four bit mantissa 1 1 1 1. The four bit exponent 1010 comes from the fact the first nonzero bit is the thirteenth bit. Subtracting three from thirteen gives the binary equivalent of the ten 1010. The mantissa is then the bits in the twelfth through ninth position. This expresses any decimal number from 15872 to 16383. This gives a possible error of approximately 3.123%. The worst case possible error is where it is not known if the number is 32 or 33. This could lead to an error of 3.125%.

There has therefore been described a system in which a binary number of 19 bits plus sign is expressed as 8 bits plus sign. This system increases the usable dynamic range of state of the art analog-to-digital converters by employing step gain for low level signals. Additionally, there is presented the quantized magnitudes with a shortened code that will reduce the load in an otherwise overloaded multiplexing system.

It will be understood that many additional changes in details, materials, steps and arrangement of parts, which have been herein described and illustrated in order to explain the nature of the invention, may be made by those skilled in the art within the principle and scope of the invention as expressed in the appended claims.

What is claimed is:

1. A gain step companding analog-to-digital conversion system comprising:
   amplifying means for providing an output signal of a selected amplification of an analog input signal, said amplifying means being a variable gain step amplifier and having feedback controls for choosing said selected amplification of one of only 48 dB gain, 30 dB gain, 12 dB gain and 0 dB gain;
   an analog-to-digital converter having a quantized window, said converter is connected to receive the output of said amplifying means, said converter providing an 11 bit plus sign digital output signal;
   digital averaging means connected to said analog-to-digital converter for providing an average digital output signal of the preceding digital output signals of said converter;
   upper threshold detector means connected to receive said average digital output signal and for providing a first trigger signal if said received average digital output signal has a one bit in either of the two most significant bits;
   lower threshold detector means connected to receive said average digital output signal and for providing a second trigger signal if said received digital signal has all zero bits in the eight most significant bits;
   gain control logic means connected to receive said first trigger signal and said second trigger signal and for providing a predetermined output signal in response to one of said first trigger signal and said second trigger signal, said predetermined output signal providing a feedback signal to said amplifying means; and
   code conversion means connected to receive said analog-to-digital converter digital output signal and said gain control logic means predetermined output signal and for providing a code converted output signal of said analog-to-digital converter digital output signal, said provided code converted output signal in an eight bit plus sign digital signal representing a nineteen bit plus sign digital signal with a maximum possible error of 3.125%.

* * * * *